United States Patent
Miyazaki (10) Patent No.: US 11,766,756 B2
(45) Date of Patent: Sep. 26, 2023

(54) SUBSTRATE SUPPORT APPARATUS AND SUBSTRATE CLEANING APPARATUS

(71) Applicant: EBARA CORPORATION, Tokyo (JP)

(72) Inventor: Mitsuru Miyazaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 187 days.

(21) Appl. No.: 16/825,540

(22) Filed: Mar. 20, 2020

(65) Prior Publication Data
US 2020/0316742 A1    Oct. 8, 2020

(30) Foreign Application Priority Data

Apr. 4, 2019   (JP) ................. 2019-071877

(51) Int. Cl.
| | | |
|---|---|---|
| *B23Q 15/12* | (2006.01) | |
| *B25B 11/00* | (2006.01) | |
| *H01L 21/67* | (2006.01) | |
| *H01L 21/687* | (2006.01) | |

(52) U.S. Cl.
CPC ............. *B23Q 15/12* (2013.01); *B25B 11/00* (2013.01); *H01L 21/67* (2013.01); *H01L 21/67051* (2013.01); *H01L 21/67259* (2013.01); *H01L 21/6875* (2013.01); *H01L 21/67023* (2013.01)

(58) Field of Classification Search
CPC ......... B23Q 15/12; B25B 11/00; H01L 21/67; H01L 21/67051; H01L 21/67259; H01L 21/6875; H01L 21/67023; H01L 21/68728; H01L 21/68742; H01L 21/67046; H01L 21/68764; H01L 21/68785; H01L 21/67057; H01L 21/67253
See application file for complete search history.

(56) References Cited

U.S. PATENT DOCUMENTS

| | | | |
|---|---|---|---|
| 2019/0176291 A1* | 6/2019 | Yang | ............. B24B 37/005 |
| 2020/0164412 A1* | 5/2020 | Oh | ................ G01N 29/024 |

FOREIGN PATENT DOCUMENTS

| | | | | |
|---|---|---|---|---|
| JP | S62-094809 A | | 5/1987 | |
| JP | H1133506 A | * | 2/1999 | |
| JP | 2002299308 A | * | 10/2002 | |
| JP | 2003092344 A | * | 3/2003 | |
| JP | 2005-019456 A | | 1/2005 | |
| JP | 2005019456 A | * | 1/2005 | |
| JP | 2006-179571 A | | 7/2006 | |
| JP | 2006-305666 A | | 11/2006 | |
| JP | 2009-233796 A | | 10/2009 | |
| JP | 2009-295751 A | | 12/2009 | |
| JP | 2013024708 A | * | 2/2013 | |
| KR | 0130138 Y1 | * | 2/1999 | |
| KR | 20200117886 A | * | 10/2014 | |

* cited by examiner

*Primary Examiner* — Jarrett J Stark
(74) *Attorney, Agent, or Firm* — BakerHostetler (57) ABSTRACT

A substrate support apparatus 100 has a support part 10 for supporting a substrate W; a moving part 50 which is adapted to abut on the support part 10 and to move the support part 10 along an axis direction; a fluid pipe 60 at least a part of which is provided in the moving part 50, through which fluid flows and an outlet port 61 of which is covered by the support part 10 when the moving part 50 abuts on the support part 10; and a detection part 90 which detects a state of the fluid.

10 Claims, 9 Drawing Sheets

SUBSTRATE SUPPORT APPARATUS AND SUBSTRATE CLEANING APPARATUS

BACKGROUND

Technical Field

The present invention relates to a substrate support apparatus for rotatably supporting a substrate and a substrate cleaning apparatus including the substrate support apparatus The present application claims the priority of Japanese Patent Application No. 2019-071877 filed on Apr. 4, 2019, the contents of which are entirely incorporated by reference.

Related Art

A spin chuck or the like that supports a substrate such as a wafer has been known. JP 2005-19456 A discloses a spin chuck having a rotation shaft and a plurality of clamping members that can clamp a wafer and can release the clamping. An interlocking ring is provided which rotates with the spin chuck while surrounding the rotation shaft and moves up and down in interlocking with an operation of the clamping members. The height of the interlocking ring is detected by a position sensor. The position sensor outputs a detection signal that continuously fluctuates according to the height of the interlocking ring. The output of the position sensor is digitized and the state of the clamping members is determined based on the digitized position information.

SUMMARY

The present invention provides a technique of understanding a state of a support part by a method different from conventional methods.

[Concept 1]
A substrate support apparatus comprising:
a support part for supporting a substrate;
a moving part which is adapted to abut on the support part and to move the support part along an axis direction;
a fluid pipe at least a part of which is provided in the moving part, through which fluid flows and an outlet port of which is covered by the support part when the moving part abuts on the support part; and
a detection part which detects a state of the fluid.

[Concept 2]
The substrate support apparatus according to concept 1, wherein
the detection part detects pressure or flow rate of the fluid flowing through the fluid pipe.

[Concept 3]
The substrate support apparatus according to concept 1 or 2, wherein
a plurality of support parts are provided,
the moving part is provided corresponding to each of the support parts, and
the fluid pipe is provided in each moving part.

[Concept 4]
The substrate support apparatus according to any one of concepts 1 to 3, wherein
the fluid is gas.

[Concept 5]
A substrate cleaning apparatus comprising:
the substrate support apparatus according to any one of concepts 1 to 4, and
a control part which determines whether the moving part abuts on the support part based on information from the detection part.

[Concept 6]
The substrate cleaning apparatus according to concept 5, wherein
the detection part, which detects pressure or flow rate of the fluid flowing through the fluid pipe, is provided to each fluid pipe,
the control part detects abnormality based on detection result from each detection part.

[Concept 7]
The substrate cleaning apparatus according to concept 6, wherein
the control part determines that an abnormality occurs when an interval between a time when the control part determines that a certain moving part abuts on a certain support part and a time when the control part determines that another moving part abuts on another support part is a first time or more.

[Concept 8]
The substrate cleaning apparatus according to concept 6 or 7, wherein
the control part determines that an abnormality occurs when an interval between a time when the control part determines that a certain moving part separates from a certain support part and a time when the control part determines that another moving part separates from another support part is a second time or more.

[Concept 9]
The substrate cleaning apparatus according to any one of concepts 6 to 8, wherein
the control part determines that an abnormality occurs when the detection part does not detect that the moving part abuts on the support part within a third time from a time when the moving part starts moving toward the support part.

[Concept 10]
The substrate cleaning apparatus according to any one of concepts 6 to 9, wherein
the control part determines that an abnormality occurs when the detection part does not detect that the moving part separates from the support part within a fourth time from a time when the moving part starts moving in a direction separating from the support part.

[Concept 11]
The substrate cleaning apparatus according to any one of concepts 6 to 10, comprising
a notification part which notifies information to prompt cleaning or replacement of the support part when the control part determines that an abnormality occurs.

When employing an aspect where the fluid pipe, whose outlet port is covered by the support part when the moving part abuts on the support part, and the detection part which detects a state of the fluid flowing through the fluid pipe are provided, it is possible to understand whether the moving part abuts on the support part by the state of the fluid, and accordingly it is possible to understand a state of the support part.

BRIEF DESCRIPTION OF DRAWINGS

FIGS. 5A to 5D are diagrams showing a relationship between a moving part and the support part that can be used in the embodiment of the present invention.

DETAILED DESCRIPTION

Embodiment

<<Configuration>>

An embodiment of a substrate processing apparatus including a substrate cleaning apparatus and the like will be described.

Figure 8:
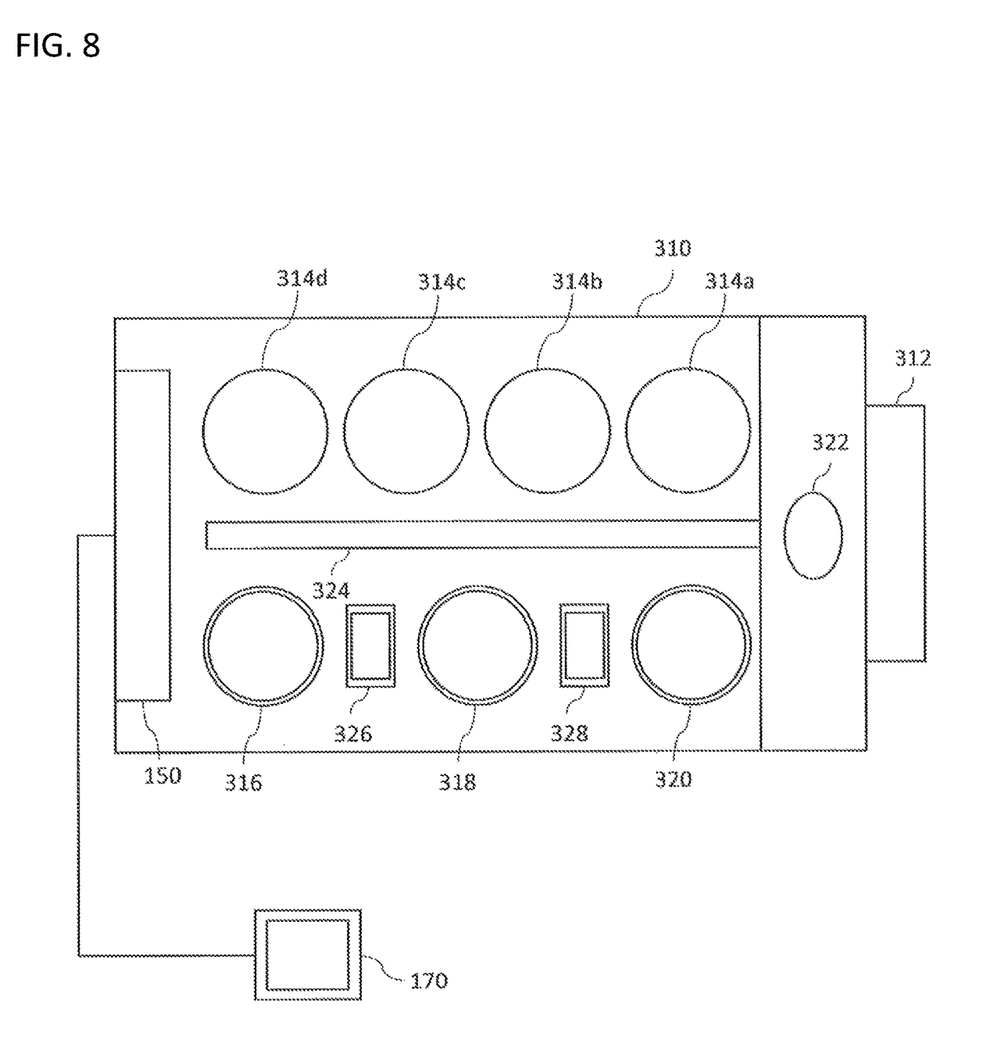
FIG. 8 is a schematic plan view showing an entire configuration of a substrate processing apparatus including the substrate cleaning apparatus according to the embodiment of the present invention.

As shown in FIG. 8, the substrate processing apparatus, according to the present embodiment, has a roughly rectangular housing 310 and a load port 312; a substrate cassette that stocks a number of substrates W is put on the load port 312. The load port 312 is placed adjacent to the housing 310. The load port 312 can be loaded with an open cassette, a SMIF (Standard Mechanical Interface) pod or a FOUP (Front Opening Unified Pod). A SMIF pod and a FOUP are hermetically sealed enclosure that stores therein a substrate cassette and covers it with a bulkhead, and whereby an environment independent of the external space can be maintained. The substrate W is, for example, a semiconductor wafer and the like.

Inside the housing 310, a plurality of (in an aspect shown in FIG. 8, four) polishing units 314a to 314d, first and second cleaning units 316 and 318 for cleaning a polished substrate W, and a drying unit 320 for drying the cleaned substrate W is contained. The polishing units 314a to 314d are arranged along a long side of the substrate processing apparatus, and the cleaning units 316 and 318 and the drying unit 320 are also arranged along the long side of the substrate processing apparatus. The substrate processing apparatus according to the present embodiment can polish various substrates W in a step of manufacturing a semiconductor wafer with a diameter of 300 mm or 450 mm, a flat panel, an image sensor such as complementary metal oxide semiconductor (CMOS) or charge coupled device (CCD), and a magnetic film in a magnetoresistive random access memory (MRAM). The substrate processing apparatus according to other embodiment may be configured to clean and dry a substrate W without a polishing unit for polishing the substrate W inside the housing 310.

In an area surrounded by the load port 312, and the polishing unit 314a and the drying unit 320 that are located on the side of the load port 312, a first transfer robot 322 is placed. Furthermore, a conveyance unit 324 is placed parallel to the polishing units 314a to 314d as well as the cleaning units 316 and 318 and the drying unit 320. The first transfer robot 322 receives a pre-polished substrate W from the load port 312 and transfers the substrate W to the conveyance unit 324, or receives a dried substrate W from the drying unit 320.

A second transfer robot 326 for transferring a substrate W between the first cleaning unit 316 and the second cleaning unit 318 is placed between the first cleaning unit 316 and the second cleaning unit 318, and a third conveyance unit 328 for transferring the substrate W between the second cleaning unit 318 and the drying unit 320 is placed between the second cleaning unit 318 and the drying unit 320. Furthermore, inside the housing 310, an control part 150 for controlling the operation of each device of the substrate processing apparatus is placed. In the present embodiment, there is described the aspect in which the control part 150 is placed inside the housing 310; however, the placement of the control part 150 is not limited to this, and the control part 150 may be placed outside the housing 310, and the control part 150 may be provided at a remote place. When the control part 150 is provided at the remote place, each device in the substrate processing apparatus is remotely controlled by the control part 150.

A roll cleaning apparatus for scrubbing a surface of a substrate W while rotating around the center axis parallel with the substrate W by bringing the roll cleaning members linearly extending almost along the full diameter of the substrate W into contact with cleaning liquid may be used for the first cleaning unit 316. For example, the roll cleaning members may be brought into contact with a substrate W to clean the substrate W while the substrate W is horizontally or vertically held or held in an inclined direction against horizontal direction, and the substrate W is being rotated. A pencil cleaning apparatus for scrubbing a surface of a substrate W by bringing the contact faces of the vertically-extending columnar pencil cleaning members into contact with cleaning liquid and moving the pencil cleaning members in one direction while rotating may be used for the second cleaning unit 318. A spin drying unit for drying a substrate W by injecting IPA steam from a moving injection nozzle toward the horizontally-held and rotating substrate W and drying the substrate W by centrifugal force by faster rotating the substrate W may be used for the drying unit 320.

The first cleaning unit 316 may use not a roll cleaning apparatus, but a pencil cleaning apparatus similar to the second cleaning unit 318 or a two-fluid jet cleaning apparatus for cleaning a surface of a substrate W by two-fluid jet. Further, the second cleaning unit 318 may use not a pencil cleaning apparatus, but a roll cleaning apparatus similar to the first cleaning unit 316, or a two-fluid jet cleaning apparatus for cleaning a surface of a substrate W by two-fluid jet.

The cleaning liquid in the present embodiment contains rinse liquid, such as deionized water (DIW), and chemical liquid, such as ammonia hydrogen peroxide (SC1), hydrochloric acid hydrogen peroxide (SC2), sulfuric acid hydrogen peroxide (SPM), sulfuric acid hydrolysate, or hydrofluoric acid. In the present embodiment, unless otherwise specified, cleaning liquid means either rinse liquid, chemical liquid or the both rinse liquid and chemical liquid.

Figure 1:
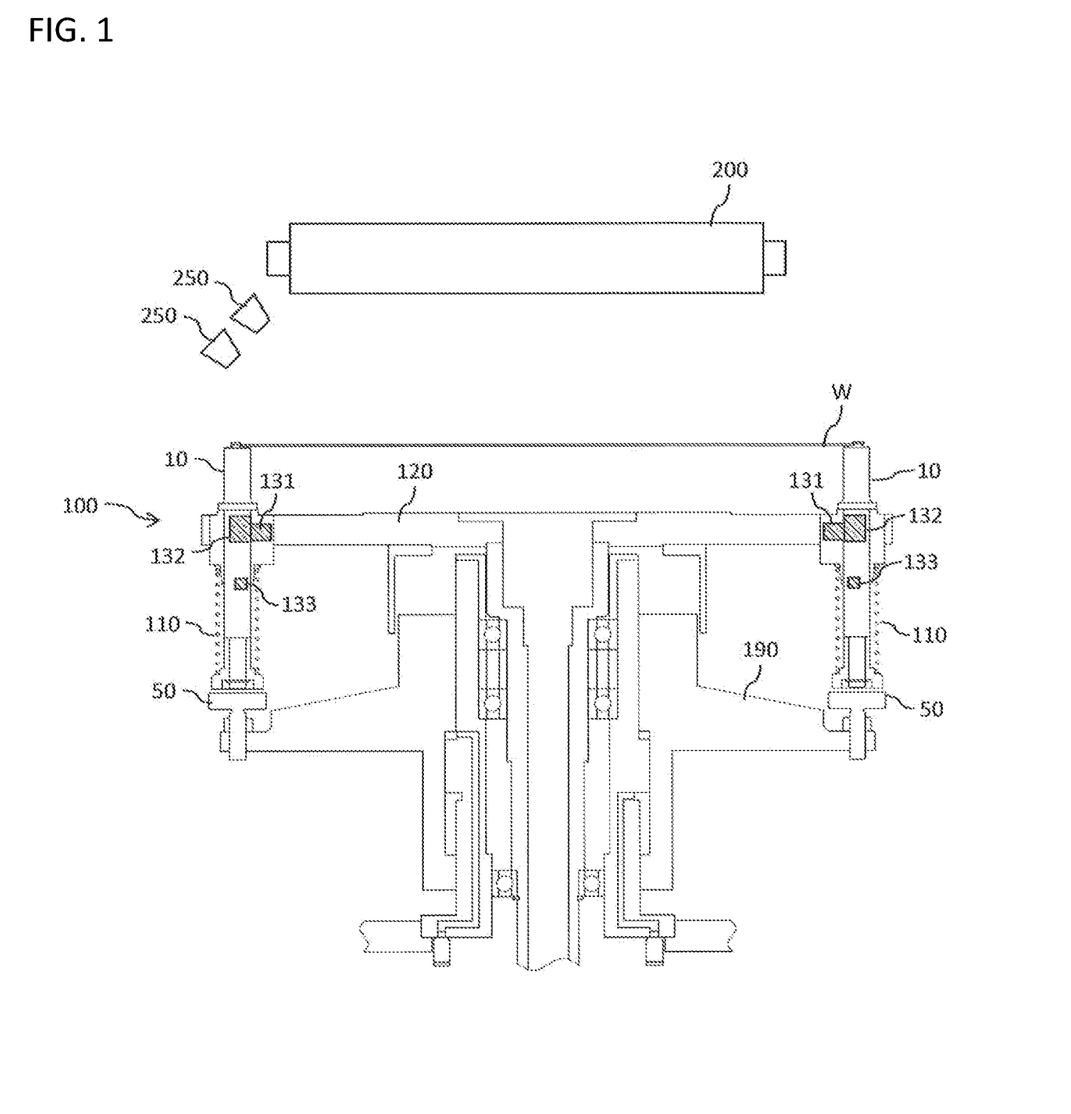
FIG. 1 is a schematic side cross-sectional view showing a configuration of a substrate cleaning apparatus that can be used in an embodiment of the present invention and is a schematic side cross-sectional view showing an aspect where a support part is located in a lower position.
Figure 2:
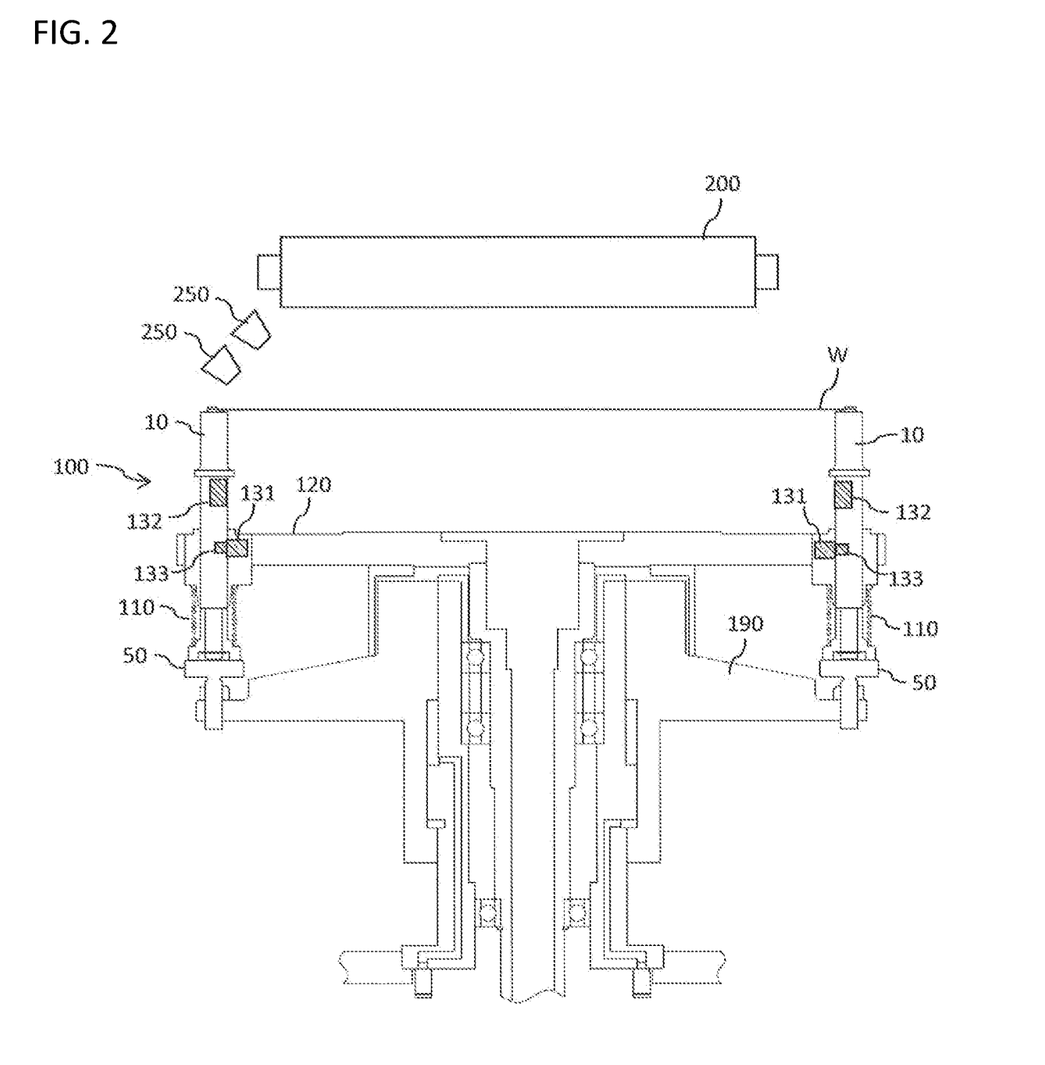
FIG. 2 is a schematic side cross-sectional view showing a configuration of the substrate cleaning apparatus that can be used in the embodiment of the present invention and is a schematic side cross-sectional view showing an aspect where the support part is located in an upper position.

As shown in FIGS. 1 and 2, the substrate cleaning apparatus of the present embodiment may have a substrate support apparatus 100 composed of a spindle apparatus that rotatably supports a substrate W and the like, one or a plurality of cleaning members 200 for cleaning the substrate W, and one or a plurality of cleaning liquid supply parts 250 that supply cleaning liquid to the substrate W. The embodiment will be described by using an aspect where the substrate W is supported so that an in-plane direction of the substrate W is a horizontal direction. However, the in-plane direction of the substrate W is not limited to the horizontal direction, but may be a vertical direction or a direction inclined from the horizontal direction. FIGS. 1 and 2 shows a roll cleaning member as an example of a cleaning member 200.

Figure 6:
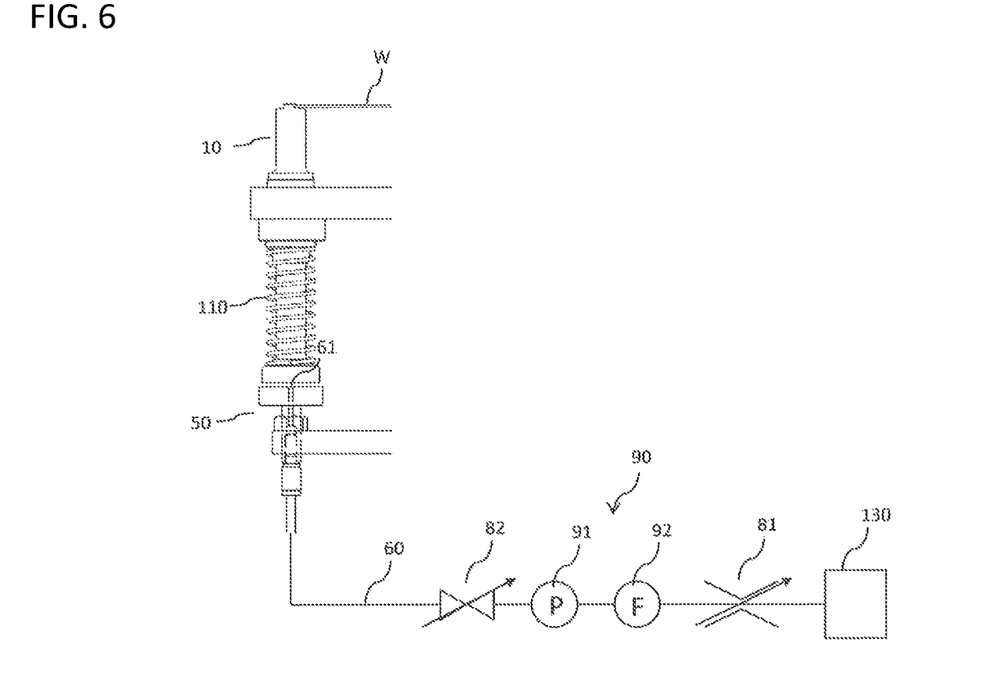
FIG. 6 is a diagram showing a detection part, an adjustment part, an open/close part, and the like that can be used in the embodiment of the present invention and is a diagram showing an aspect where the moving part is separated from the support part.
Figure 7:
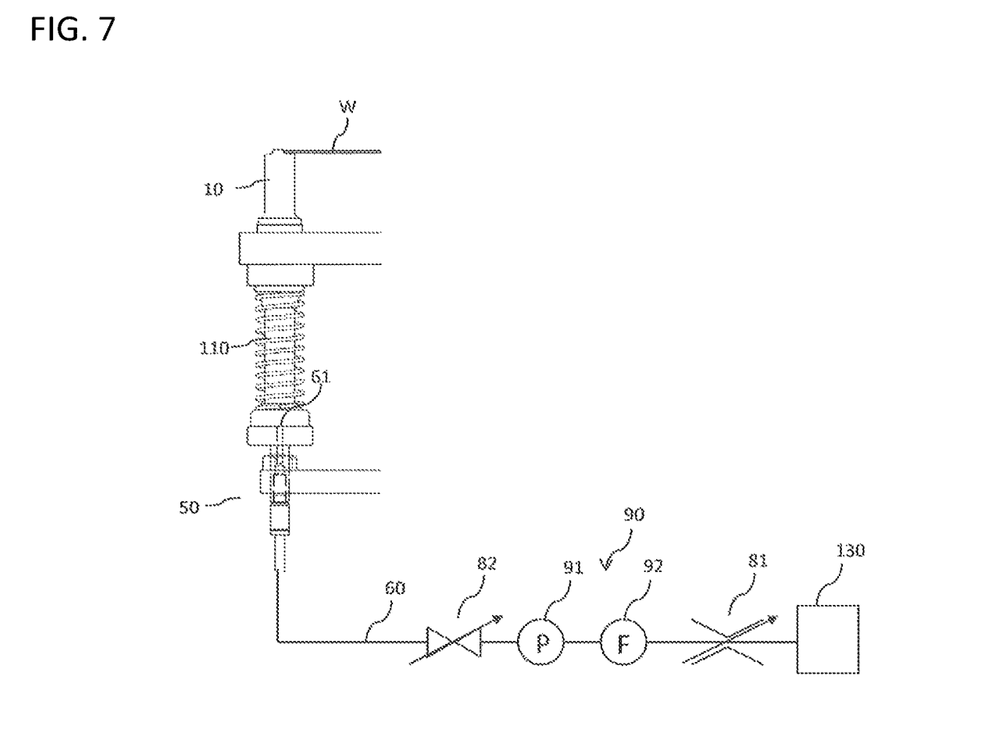
FIG. 7 is a diagram showing the detection part, the adjustment part, the open/close part, and the like that can be used in the embodiment of the present invention and is a diagram showing an aspect where the moving part abuts on the support part.
Figure 9A:
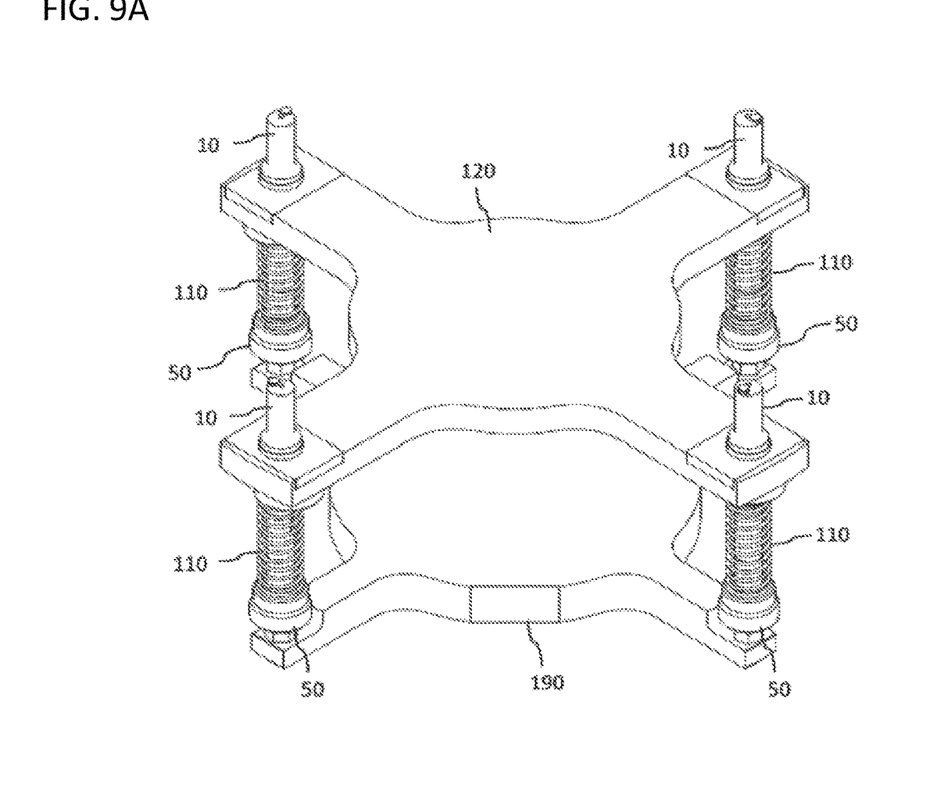
FIG. 9A is a perspective view showing the support part, a base mount, the moving part, and a connection part that can be used in the embodiment of the present invention.
Figure 9B:
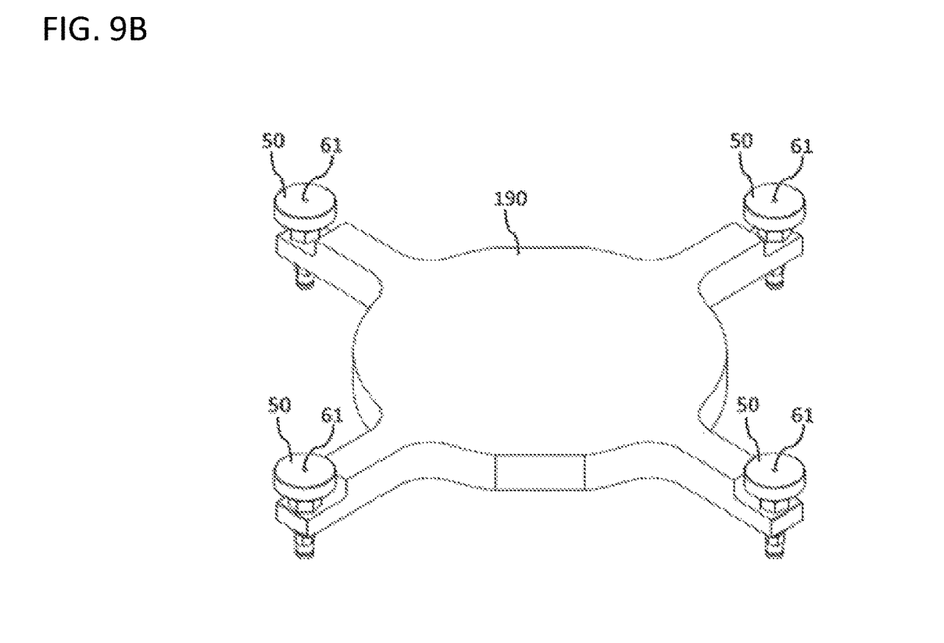
FIG. 9B is a perspective view showing the moving part and the connection part that can be used in the embodiment of the present invention.

As shown in FIGS. 6 and 7, the substrate support apparatus 100 may have a support part 10 such as a spindle or the like for supporting the substrate W while rotating the substrate W, a moving part 50 which is adapted to abut on the support part 10 and to move the support part 10 along an axis direction, a fluid pipe 60 at least a part of which is provided in the moving part 50, through which fluid flows and an outlet port 61 of which is covered by the support part 10 when the moving part 50 abuts on the support part 10, and a detection part 90 that detects a state of the fluid. The moving part 50 is, for example, an unclamp ring and may be composed of a bolt or the like. The "axis direction" is a normal direction of the substrate W and is a vertical direction in FIGS. 6 and 7. As shown in FIGS. 9A and 9B, the moving parts 50 may be connected to each other through a connection part 190.

Figure 4:
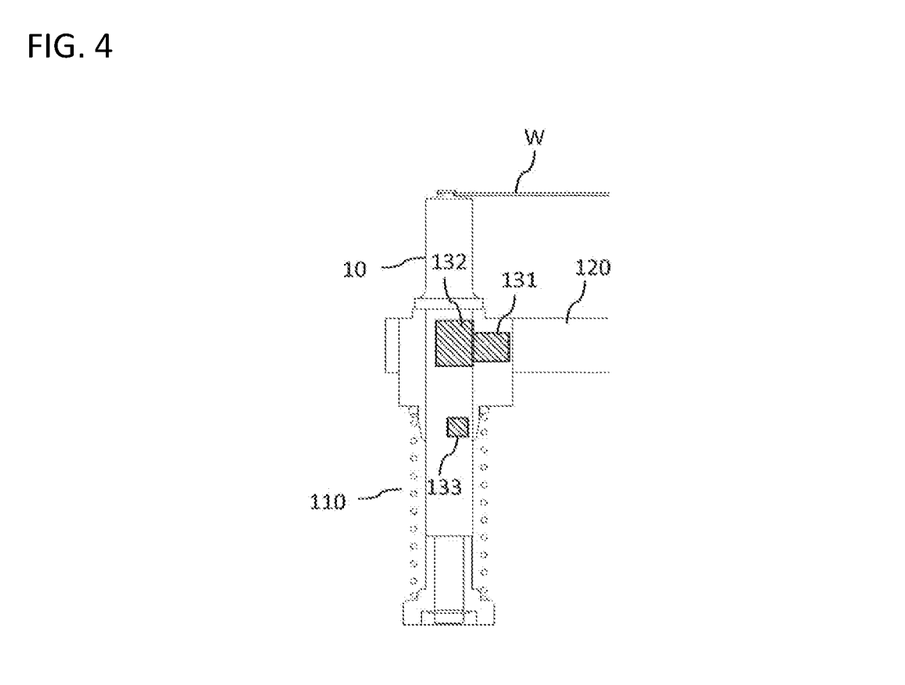
FIG. 4 is a side cross-sectional view of the support part that can be used in the embodiment of the present invention.

As shown in FIG. 4, the support part 10 may be provided by passing through a base mount 120. A first magnet 131 is attached to the base mount 120, and the first magnet 131 may be arranged to face a side surface of the support part 10. On the other hand, the support part 10 may be provided with a second magnet 132 and a third magnet 133 separated from each other in the vertical direction. The second magnet 132 and the third magnet 133 are arranged in positions shifted from each other in a circumferential direction of the support part 10.

In such an aspect, when the support part 10 is in the first position (lower position), the first magnet 131 and the second magnet 132 face each other, an attraction force acts between the first magnet 131 and the second magnet 132, and the support part 10 is in a clamp position where the support part 10 holds the substrate W (see FIG. 1). Since the second magnet 132 and the third magnet 133 are arranged in positions shifted from each other in the circumferential direction of the support part 10, when the support part 10 is positioned in the second position (upper position), a rotating force acts on the support part 10 as the support part 10 moves. As a result, the support part 10 is in an unclamp position where the support part 10 releases holding of the substrate W (see FIG. 2). The support part 10 moves along the normal direction (vertical direction) of the substrate W in this way, so that the support part 10 can hold and release the substrate W. This mechanism is described in detail in JP 2009-295751 A, and the description of JP 2009-295751 A is incorporated by reference herein in its entirety.

The detection part 90 may detect pressure and/or flow rate of the fluid flowing through the fluid pipe 60. When the detection part 90 detects the pressure of the fluid flowing through the fluid pipe 60, the detection part 90 has a pressure detection part 91 such as a pressure sensor or a pressure gauge (see FIGS. 6 and 7). When the detection part 90 detects the flow rate of the fluid flowing through the fluid pipe 60, the detection part 90 has a flow rate detection part 92 such as a flow rate meter.

The fluid may be a compressed fluid to which pressure is applied. The fluid may be gas or liquid. However, when liquid is used, there is risk that the substrate W is contaminated by the liquid, so that from this viewpoint, an aspect where gas is used is beneficial. As the gas, for example, air, nitrogen, or the like can be used. As the liquid, for example, pure water, IPA, or the like can be used. When the gas is used as the fluid, it is beneficial that a pressure difference and a flow rate difference can be easily detected and detection sensitivity can be expected to be improved.

The fluid is supplied from a fluid supply part 130 (see FIGS. 6 and 7). The fluid supply from the fluid supply part 130 may be performed at all times or the control part 150 may perform control so that the fluid supply is started a predetermined time before movement by the moving part 50 is started. When employing an aspect where the fluid supply from the fluid supply part 130 is performed at all times, it is possible to prevent liquid such as cleaning liquid from entering into the fluid pipe 60. On the other hand, when employing an aspect where the fluid supply is started a predetermined time before the movement by the moving part 50 is started, it is possible to reduce the amount of liquid to be supplied and a power saving effect can be expected. When employing the aspect where the fluid supply is started a predetermined time before the movement by the moving part 50 is started, assuming that liquid such as cleaning liquid enters into the fluid pipe 60, a first pressure of fluid at a time point when the fluid is supplied from the fluid supply part 130 may be larger than a second pressure of fluid at a time point when the fluid is continuously flowed after the fluid is supplied. As an example, the first pressure may be 1.5 to 4 times the second pressure. By employing such an aspect, it is possible to discharge liquid such as cleaning liquid that has entered into the fluid pipe 60 to the outside and then continuously supply a fluid (with the second pressure).

As shown in FIGS. 6 and 7, the fluid pipe 60 may be provided with an adjustment part 81 such as a flow rate adjustment valve or a pressure adjustment valve that adjusts the flow rate of the fluid or may be provided with an open/close part 82 such as an open/close valve that turns ON/OFF of the supply of the fluid. The open/close part 82 may be able to adjust the flow rate of the fluid.

Figure 3:
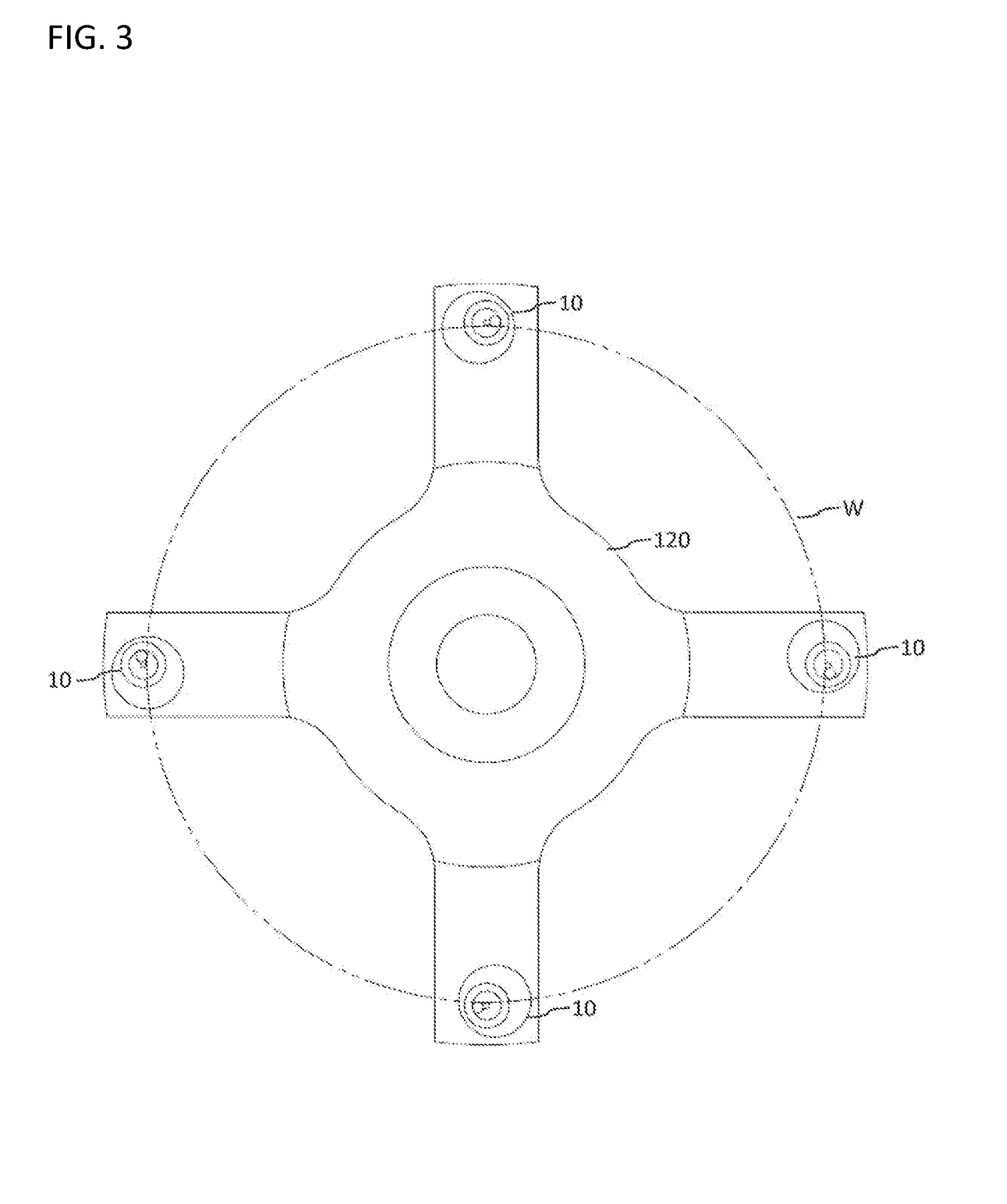
FIG. 3 is a plan view of the support part and a substrate, which can be used in the embodiment of the present invention, viewed from above.

A plurality of support parts 10 may be provided, the moving part 50 may be provided corresponding to each of the support parts 10, and the fluid pipe 60 may be provided in each of the moving parts 50. In an aspect shown in FIG. 3, four support parts 10 are provided. The moving part 50 may be provided corresponding to each of the four support parts 10 and the fluid pipe 60 may be provided inside each moving part 50.

The control part 150 (see FIG. 8) that controls the substrate processing apparatus including the substrate cleaning apparatus may determine whether the moving part 50 abuts on the support part 10 based on information from the detection part 90.

The detection part 90 may be provided to each fluid pipe 60, and the control part 150 may detect abnormality by comparing detection result from each detection part 90. For example, the control part 150 may determine that there is abnormality when the pressure or the flow rate of the fluid in a certain fluid pipe 60 is greater than an average value of pressure or an average value of flow rates of the fluids in the other fluid pipes 60 by a first pressure threshold value or a first flow rate threshold value or more or smaller than the average value of pressure or the average value of flow rates of the fluids in the other fluid pipes 60 by a second pressure threshold value or a second flow rate threshold value or more.

The control part 150 may determine that an abnormality occurs when an interval between a time when the control part 150 determines that a certain moving part 50 abuts on a certain support part 10 and a time when the control part 150 determines that another moving part 50 abuts on another support part 10 is a first relative reference time or more. The control part 150 may determine that an abnormality occurs when an interval between a time when it is determined that a certain moving part 50 abuts on a certain support part 10 and an average of times when it is determined that the other moving parts 50 abut on the support parts 10 is a first average reference time or more. In the present application, the first relative reference time and the first average reference time may be referred to as a first time.

The control part 150 may determine that an abnormality occurs when an interval between a time when the control part 150 determines that a certain moving part 50 separates from a certain support part 10 and a time when the control part 150 determines that another moving part 50 separates from another support part 10 is a second relative reference time or more. The control part 150 may determine that an abnormality occurs when an interval between a time when it is determined that a certain moving part 50 separates from a certain support part 10 and an average of times when it is determined that the other moving parts 50 separates from the support parts 10 is a second average reference time or more. In the present application, the second relative reference time and the second average reference time may be referred to as a second time.

The control part 150 may determine that an abnormality occurs when the detection part 90 does not detect that the moving part 50 abuts on the support part 10 within a third time from a time when the moving part 50 starts moving toward the support part 10.

The control part 150 may determine that an abnormality occurs when the detection part 90 does not detect that the moving part 50 separates from the support part 10 within a fourth time from a time when the moving part 50 starts moving in a direction separating from the support part 10.

The time when the moving part 50 abuts on the support part 10 may be measured by the detection part 90 from a time point when the moving part 50 starts moving (for example, upward moving) toward the support part 10. The time when the moving part 50 separates from the support part 10 may be measured by the detection part 90 from a time point when the moving part 50 starts moving (for example, downward moving) in a direction separating from the support part 10.

A notification part 170 may be provided that notifies information that prompts cleaning or replacement of the support part 10 when the control part 150 determines that an abnormality occurs (see FIG. 8). For example, the notification part 170 may prompt to perform cleaning on portions to be sliding surfaces on the base mount 120 and the support part 10.

Next, an example of a processing method according to the present embodiment will be described mainly with reference to FIGS. 5A to 5D. The processing method described below will be described by using an aspect where air is used as the fluid, a flow rate meter is used the flow rate detection part 92, a pressure gauge is used as the pressure detection part 91, and four support parts 10 and four moving parts 50 are provided.

Figure 5A:
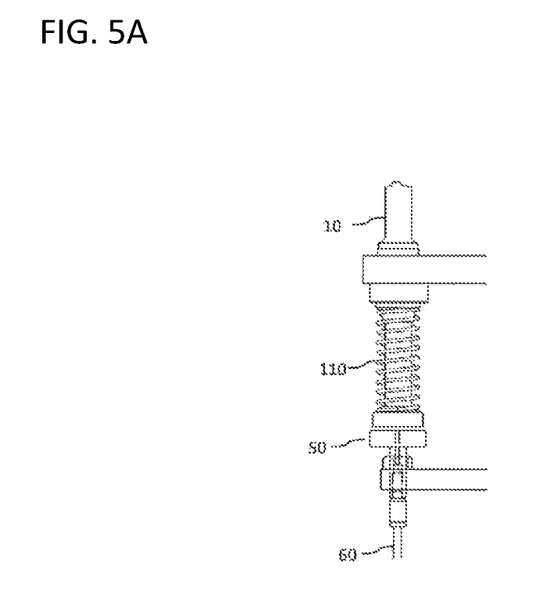
FIG. 5A is a side cross-sectional view showing an aspect where the moving part and the support part are positioned in a first position (lower position)

The moving part 50 and the support part 10 are positioned in a first position (lower position). In this case, as shown in FIG. 5A, a top surface (upper surface) of the moving part 50 and a bottom surface (lower surface) of the support part 10 are separated from each other. The outlet port 61 is not covered by the support part 10, so that the fluid flowing through the fluid pipe 60 flows out from the outlet port 61. Therefore, values indicated by the flow rate meter and the pressure gauge are constant values. The first position is a rotational position and a holding position of the substrate W. On the other hand, in the second position (upper position) described later, the holding of the substrate W is released, and the second position is the unclamp position.

Figure 5B:
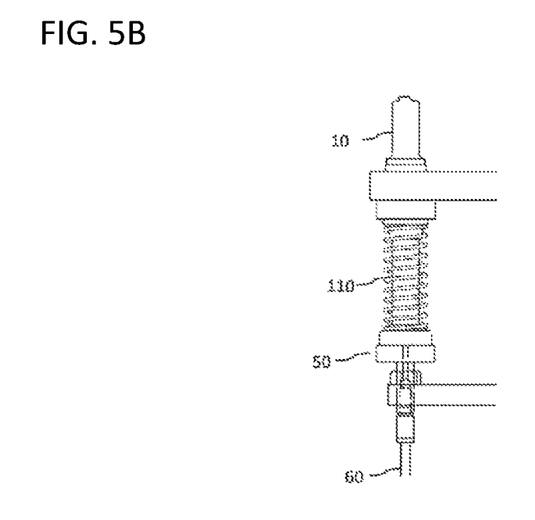
FIG. 5B is a side cross-sectional view showing an aspect where a top surface of the moving part abuts on a bottom surface of the support part.

The moving part 50 starts rising, and the top surface of the moving part 50 abuts on the bottom surface of the support part 10 (see FIG. 5B. As a result, the fluid flowing out from the outlet port 61 reduces, the flow rate of air measured by the flow rate meter reduces or becomes zero, and the pressure measured by the pressure gauge increases.

The control part 150 monitors a flow rate value of the flow rate meter and a pressure value of the pressure gauge and determines whether four timings when the moving parts 50 abut on the support parts 10 are the same. When there is a case in which a timing when a moving part 50 abuts on a support part 10 is delayed, this means that, for example, the support part 10 is positioned on the second position side (for example, the upper position side) or the position of the moving part 50 with respect to the connection part 190 (see FIGS. 9A and 9B) is shifted to the first position side (for example, the lower position side). On the other hand, when there is a case in which a timing when a moving part 50 abuts on a support part 10 is too early, this means that, for example, the position of the support part 10 is shifted to the first position side (for example, the lower position side) due to loosening of a screw or the like or the position of the moving part 50 with respect to the connection part 190 (see FIGS. 9A and 9B) is shifted to the second position side (for example, the upper position side). When the timing is shifted in this way, a risk occurs where transfer of the substrate W fails or the substrate W is cracked. In this case, a buffer is provided, and it may be determined that it is normal when an interval between a time when it is determined that a certain moving part 50 abuts on a certain support part 10 and a time when it is determined that another moving part 50 abuts on another support part 10 is smaller than the first time (the first relative reference time or the first average reference time). On the other hand, the control part 150 may determine that an abnormality occurs when at least one interval between a time when it is determined that a certain moving part 50 abuts on a certain support part 10 and a time when it is determined that another moving part 50 abuts on another support part 10 is equal to or greater than the first time.

When the moving part 50 and the support part 10 that is moved by the moving part 50 move to the second position (upper position) that is a transfer position of the substrate W, the support part 10 is located in the unclamp position and the support part 10 receives the substrate W (also see FIG. 4). A time from a time when the moving part 50 starts rising to when the support part 10 moves to the second position (upper position) is, for example, about one second. When the support part 10 already holds the substrate W (already holds the substrate W in FIGS. 5A and 5B, the processed substrate W is carried out, the substrate W to be processed from now on is carried in, and the substrates W are exchanged.

When the support part 10 receives the substrate W, the moving part 50 moves toward the first position (lower position). As a result, the support part 10 also moves toward the first position (lower position).

After the moving part 50 and the support part 10 move somewhat, the top surface of the moving part 50 and the bottom surface of the support part 10 are separated from each other (see FIG. 5A. In this case, the outlet port 61 is released, so that the flow rate of air measured by the flow rate meter increases and the pressure measured by the pressure gauge decreases.

The control part 150 monitors the flow rate value of the flow rate meter and the pressure value of the pressure gauge and determines whether four timings when the moving parts 50 abut on the support parts 10 are the same. When there is a case in which a timing when a moving part 50 separates from a support part 10 is delayed, this means that, for example, a timing when the support part 10 moves downward is delayed, and this also means that a timing when the substrate W is held is delayed. On the other hand, when there is a case in which a timing when a moving part 50 separates from a support part 10 is too early, this means that, for example, a timing when the support part 10 moves downward is too early, and this also means that a timing when the substrate W is held is too early. Thus, it is possible to confirm a predictive sign of a failure of holding the substrate and a failure of transferring the substrate. In this case, a buffer is provided, and it may be determined that it is normal when an interval between a time when it is determined that a certain moving part 50 separates from a certain support part 10 and a time when it is determined that another moving part 50 separates from another support part 10 is smaller than the second time (the second relative reference time or the second average reference time). On the other hand, the control part 150 may determine that an abnormality occurs when at least one interval between a time when it is determined that a certain moving part 50 separates from a certain support part 10 and a time when it is determined that another moving part 50 separates from another support part 10 is equal to or greater than the second time.

When the control part 150 determines that an abnormality occurs, the notification part 170 may prompt to perform cleaning of portions to be sliding surfaces between the base mount 120 and the support part 10. When a predictive sign of occurrence of malfunction (described later) is confirmed even though no abnormality is confirmed, the notification part 170 may prompt to perform cleaning of portions to be sliding surfaces between the base mount 120 and the support part 10.

Figure 5C:
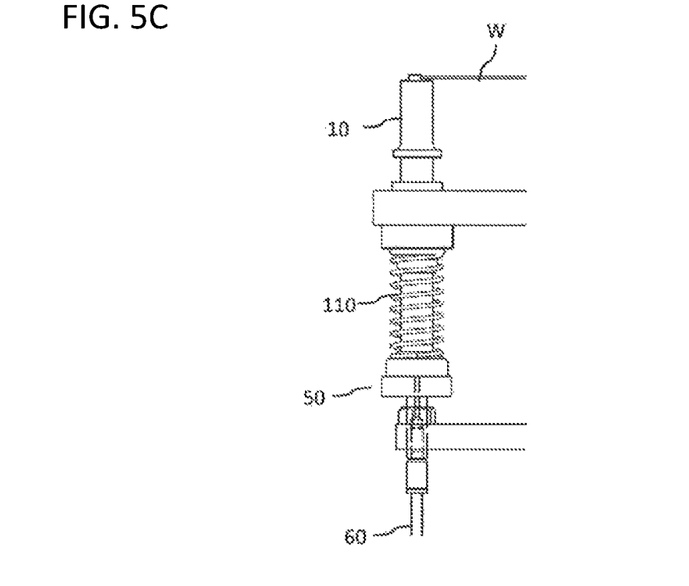
FIG. 5C is a side cross-sectional view showing an aspect where the moving part and the support part are positioned in a second position (upper position)
Figure 5D:
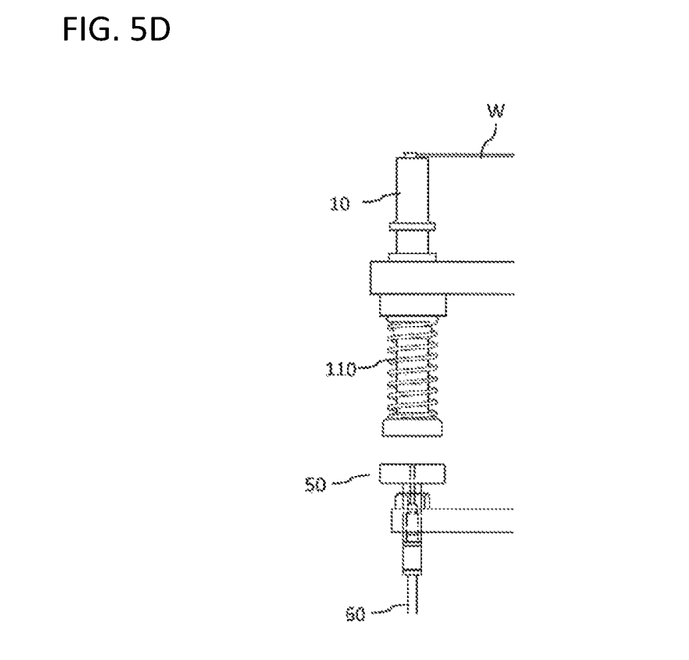
FIG. 5D is a side cross-sectional view showing an aspect where an abnormality occurs in which the support part is positioned in the second position (upper position) even though the moving part is positioned in the first position (lower position)

In a normal state, a state transition of FIG. 5A→FIG. 5B→FIG. 5C→FIG. 5A is repeated. Specifically, the state transits from a state shown in FIG. 5C to a state shown in FIG. 5A by an elastic force of an elastic member 110 such as a spring provided to the support part 10. However, when an abnormality occurs in a movement from the second position to the first position, a state as shown in FIG. 5D occurs, and the moving part 50 is positioned in the first position, but the support part 10 is still positioned in the second position. In this case, a timing when the moving part 50 separates from the support part 10 is too early in a position where there is abnormality. The support part 10 slides with respect to the base mount 120. When a sliding force of the support part 10 with respect to the base mount 120 increases, the state as shown in FIG. 5D occurs.

When one of the support parts 10 is in the state as shown in FIG. 5D, the support part 10 is in a state of not holding the substrate W (unclamp state). Therefore, when the substrate W is rotated in such a state, the substrate W is broken. The state as shown in FIG. 5D may be detected by detecting a fact that the moving part 50 starts moving toward the support part 10 (see FIGS. 5A and 5B) and a timing when the moving part 50 abuts on the support part 10 is delayed.

<<Effects>>

Next, effects which are effects of the embodiment of the configuration described above and which are not yet described will be mainly described. Even when not described in "configuration", all configurations described in "effects" can be employed in the present invention.

When employing an aspect where the fluid pipe 60, whose outlet port 61 is covered by the support part 10 when the moving part 50 abuts on the support part 10, and the detection part 90 which detects a state of the fluid flowing through the fluid pipe 60 are provided (see FIGS. 6 and 7), it is possible to understand whether the moving part 50 abuts on the support part 10 by the state of the fluid, and accordingly it is possible to understand a state of the support part 10. According to this aspect, it is not necessary to provide a member generating heat such as a power supply in a housing (not shown in the drawings) of the substrate cleaning apparatus. Therefore, this aspect is excellent in that there is no risk of firing caused by heat. In particular, when IPA is used as cleaning liquid, a heat source cannot be installed in the housing because of risk of ignition. However, according to the present aspect, it is possible to cope with a case in which IPA is used as cleaning liquid, so that the present aspect is excellent.

In the present aspect, even in a state where splash of liquid is spreading, such as a case in which the substrate W is being cleaned by liquid like cleaning liquid, it is possible to accurately detect whether the moving part 50 abuts on the support part 10 without being disturbed by the splash.

Although it is difficult to confirm a slight shift in an aspect that confirms a physical position, in the aspect described above, it is possible to understand a relationship between the support part 10 and the moving part 50 through the flow rate and/or the pressure of the fluid, so that it is possible to extremely accurately confirm the relationship between the support part 10 and the moving part 50.

When the detection part 90 detects the pressure of the fluid flowing through the fluid pipe 60, the detection part 90 can understand whether the moving part 50 abuts on the support part 10 by the pressure of the fluid. When the detection part 90 detects the flow rate of the fluid flowing through the fluid pipe 60, the detection part 90 can understand whether the moving part 50 abuts on the support part 10 by the flow rate of the fluid.

When employing an aspect where the moving part 50 is provided corresponding to each support part 10 and the fluid pipe 60 is provided for each moving part 50, it is possible to understand whether each moving part 50 abuts on the support part 10.

When employing an aspect where the detection part 90 is provided for each fluid pipe 60 and the control part 150 detects abnormality by comparing detection results from each detection part 90, it is possible to relatively detect presence or absence of abnormality by comparing a certain moving part 50 with the other moving parts 50. A shift of detection result in the detection part 90 means a shift of holding timing by the support part 10 of the substrate W.

When employing an aspect where it is determined that an abnormality occurs when at least one of intervals between a time when it is determined that a certain moving part 50 abuts on a certain support part 10 and a time when it is determined that another moving part 50 abuts on another support part 10 is the first relative reference time or more, it is possible to relatively detect presence or absence of abnormality by comparing a moving part 50 with the other moving parts 50 at a timing when the moving part 50, for example, moves upward and abuts on the support part 10. When a holding timing is shifted, there is a possibility that the substrate W is decentered and held, so that when there is a shift equal to or greater than the first relative reference time, the notification part 170 (see FIG. 8) may issue notification to confirm a holding state of the substrate W.

When employing an aspect where it is determined that an abnormality occurs when an interval between a time when it is determined that a certain moving part 50 abuts on a certain support part 10 and an average of times when it is determined that the other moving parts 50 abut on the support parts 10 is the first average reference time or more, it is possible to relatively detect presence or absence of abnormality by comparing the time with an average of times when the moving parts 50, for example, move upward and abut on the support parts 10.

When employing an aspect where it is determined that an abnormality occurs when at least one of intervals between a time when it is determined that a certain moving part 50 separates from a certain support part 10 and a time when it is determined that another moving part 50 separates from another support part 10 is the second relative reference time or more, it is possible to relatively detect presence or absence of abnormality by comparing a moving part 50 with the other moving parts 50 at a timing when the moving part 50, for example, moves downward and separates from the support part 10.

When employing an aspect where it is determined that an abnormality occurs when an interval between a time when it is determined that a certain moving part 50 separates from a certain support part 10 and an average of times when it is determined that the other moving parts 50 separates from the support parts 10 is the second average reference time or more, it is possible to relatively detect presence or absence of abnormality by comparing the time with an average of times when the moving parts 50, for example, move downward and abut on the support parts 10.

When employing an aspect where it is determined that an abnormality occurs when the detection part 90 does not detect that the moving part 50 abuts on the support part 10 within the third time from a time when the moving part 50 starts moving toward the support part 10, it is possible to detect presence or absence of abnormality based on a predetermined absolute time at a timing when the moving part 50, for example, moves upward and abuts on the support part 10.

When employing an aspect where it is determined that an abnormality occurs when the detection part 90 does not detect that the moving part 50 separates from the support part 10 within the fourth time from a time when the moving part 50 starts moving in a direction separating from the support part 10, it is possible to detect presence or absence of abnormality based on a predetermined absolute time at a timing when the moving part 50, for example, moves downward and separates from the support part 10.

When employing an aspect where the notification part 170 notifies information that prompts cleaning or replacement of the support part 10 when it is determined that an abnormality occurs, it is possible to prompt a user to clean or replace the support part 10 and normally move the support part 10, and accordingly it is possible to improve cleaning efficiency of the substrate W.

When the control part 150 determines that an abnormality occurs, the control part 150 may perform control so as to stop processing in the substrate cleaning apparatus. When an abnormality occurs, there is a possibility that the substrate W is not held in a normal state. When the substrate W is not held in a normal state by the support part 10, if the substrate W is rotated by the support part 10, there is a possibility that the substrate W runs off from the support part 10 and the substrate W is damaged. When employing the present aspect, it is possible to prevent occurrence of such a situation.

When the control part 150 detects a predictive sign of occurrence of abnormality, the notification part 170 may notify information that prompts cleaning or replacement of the support part 10. In this case, it is possible to prompt cleaning or replacement of the support part 10 before an abnormality occurs, so that it is possible to prevent degradation of cleaning efficiency of the substrate W. An example of the predictive sign can be a case where the pressure or the flow rate does not exceed a threshold value but is close to the threshold value.

Regarding the first time described above, for example, a first preliminary time (for example, 80% or 90% of the first time) shorter than the first time (the first relative reference time or the first average reference time) is defined, and a predictive sign of occurrence of abnormality is detected when a timing when the moving part 50 abuts on the support part 10 exceeds the first preliminary time in a case of comparing the certain moving part 50 with the other moving parts 50. Regarding the second time described above, for example, a second preliminary time (for example, 80% or 90% of the second time) shorter than the second time (the second relative reference time or the second average reference time) is defined, and a predictive sign of occurrence of abnormality is detected when a timing when the certain moving part 50 separates from the support part 10 exceeds the second preliminary time in a case of comparing the certain moving part 50 with the other moving parts 50. Regarding the third time described above, for example, a third preliminary time shorter than the third time is defined, and a predictive sign of occurrence of abnormality is detected when the moving part 50 abuts on the support part 10 at a timing after the third preliminary time (for example, 95% of the third time) from a time when the moving part 50 starts moving toward the support part 10. For example, a fourth preliminary time (for example, 95% of the fourth time) shorter than the fourth time is defined, and a predictive sign of occurrence of abnormality is detected when the moving part 50 separates from the support part 10 at a timing after the fourth preliminary time from a time when the moving part 50 starts moving in a direction separating from the support part 10.

The description of each embodiments and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like. The substrate support apparatus 100 of the present embodiment can be employed in various modules such as an IPA module, a PEN module, and a two-liquid jet module.

Reference Signs List

10 support part
50 moving part
60 fluid pipe
61 outlet port
90 detection part
100 substrate support apparatus
150 control part
170 notification part
W substrate

What is claimed is:

1. A substrate cleaning apparatus comprising:
    a support part for supporting a substrate;
    a moving part configured to be separate from the support part in a first state, wherein the moving part is configured to move to the support part, abut the support part in a second state and move the support part along an axis direction in the second state;
    a fluid pipe at least a part of which is provided in the moving part, through which gas flows and an outlet port of which is covered by the support part when the moving part abuts on the support part in the second state;
    a detection part which detects pressure or flow rate of the gas; and
    a control part configured to determine whether the moving part abuts the support part in the second state when the pressure of the gas detected by the detection part increased or the flow rate of the gas detected by the detection part reduced.

2. The substrate cleaning apparatus according to claim 1, wherein
    a plurality of support parts are provided,
    the moving part is provided corresponding to each of the support parts, and
    the fluid pipe is provided in each moving part.

3. The substrate cleaning apparatus according to claim 1, wherein
    a plurality of fluid pipes are provided,
    the detection part is provided to each fluid pipe, and
    the control part detects abnormality based on detection result from each detection part.

4. The substrate cleaning apparatus according to claim 3, wherein
    the control part determines that an abnormality occurs when an interval between a time when the control part determines that a certain moving part abuts on a certain support part and a time when the control part determines that another moving part abuts on another support part is a first time or more.

5. The substrate cleaning apparatus according to claim 3, wherein
    the control part determines that an abnormality occurs when an interval between a time when the control part determines that a certain moving part separates from a certain support part and a time when the control part determines that another moving part separates from another support part is a second time or more.

6. The substrate cleaning apparatus according to claim 3, wherein
    the control part determines that an abnormality occurs when the detection part does not detect that the moving part abuts on the support part within a third time from a time when the moving part starts moving toward the support part.

7. The substrate cleaning apparatus according to claim 3, wherein
    the control part determines that an abnormality occurs when the detection part does not detect that the moving part separates from the support part within a fourth time from a time when the moving part starts moving in a direction separating from the support part.

8. The substrate cleaning apparatus according to claim 3, comprising
    a notification part which notifies information to prompt cleaning or replacement of the support part when the control part determines that an abnormality occurs.

9. The substrate cleaning apparatus according to claim 1, wherein a top surface of the moving part abuts on a bottom surface of the support part when the moving part abuts on the support part in the second state.

10. The substrate cleaning apparatus according to claim 1, wherein the moving part is separated from the support part when the moving part does not abut on the support part in the first state.

* * * * *